United States Patent [19]
Zinn

[11] 3,818,328
[45] June 18, 1974

[54] FERROMAGNETIC HETEROJUNCTION DIODE

[75] Inventor: Werner Zinn, Julich, Germany

[73] Assignee: Siemens Aktiengesellschaft, Berlin and Munich, Germany

[22] Filed: Aug. 2, 1972

[21] Appl. No.: 277,158

Related U.S. Application Data

[63] Continuation-in-part of Ser. No. 76,021, Sept. 28, 1970, abandoned.

[30] Foreign Application Priority Data

Sept. 30, 1969 Germany ............................ 1949359

[52] U.S. Cl. .... 324/43 R, 317/235 H, 317/235 AC, 317/235 AD, 317/235 AP, 317/235 R

[51] Int. Cl. ............................ H01l 3/16, H01l 9/10

[58] Field of Search... 317/235 H, 235 AP, 235 AC, 317/235 AD; 324/43 R

[56] References Cited

UNITED STATES PATENTS

| | | | |
|---|---|---|---|
| 3,541,400 | 11/1970 | Esaki et al. | 317/234 |
| 3,544,865 | 12/1970 | Holtzberg et al. | 317/235 AP |

*Primary Examiner*—Rudolph V. Rolinec
*Assistant Examiner*—William D. Larkins
*Attorney, Agent, or Firm*—Hill, Gross, Simpson, Van Santen, Steadman, Chiara & Simpson

[57] ABSTRACT

A magnetically controllable electronic diode formed of a pair of electrodes spaced apart from one another by a layer of a ferromagnetic semiconductor material in contact with one of the electrodes and a layer of a ferromagnetic or metamagnetic electrical insulator material in contact with the other electrode and with the layer of ferromagnetic semiconductor material. The ferromagnetic and metamagnetic materials are composed of transition element chalcogenides, preferably rare earth chalcogenides such as europium sulfide or selenide, binary chromium thiospinel and binary chromium halogen spinel chalcogenides of the general formula: A $Cr_2$ $X_3$ Z wherein A is selected from the group of Cu, Cd, Eu, Fe, Hg, Zn and mixtures thereof; X is selected from the group S, Se, Te and mixtures thereof; and Z is selected from the group Br, Cr, I and mixtures thereof. The impedance characteristics of the diode are readily controlled by select application of an external magnetic field controlled in its direction and amplitude so that the diode has wide utility as an electronic circuit component, such as a magnetically controllable electronic switch means, or as a detector means for the direction and strength of magnetic fields.

27 Claims, 3 Drawing Figures

INVENTOR
Werner Zinn

BY Hill, Sherman, Meroni, Gross & Simpson ATTYS.

FERROMAGNETIC HETEROJUNCTION DIODE

CROSS-REFERENCE TO RELATED APPLICATIONS

This is a continuation-in-part application of U.S. Ser. No. 76,021, Filed Sept. 28, 1970, now abandoned.

Attention is also directed to German publication application No. 1,949,359, dated Apr. 29, 1972 and Swiss Patent No. 516,228, dated Nov. 30, 1971, both of which are based on German patent application No. P 19 49 359.5, filed Sept. 30, 1969, the priority of which is claimed herein. All of the above disclosures are incorporated herein by reference.

BACKGROUND OF THE INVENTION

1. Field of the Invention

The invention relates to an electronic diode and more particularly to an electronic diode in which the impedance may be controlled by an externally applied magnetic field.

2. Prior Art

Diodes composed of a ferromagnetic semiconductor material, in which the impedance characteristics are at least to some extent altered by an externally applied magnetic field are known. However, such diodes have an insufficient number of switching states for controlling impedance and are thus of limited utility.

SUMMARY OF THE INVENTION

The invention generally provides a magnetically controllable electronic diode structure constructed so that a layer of ferromagnetic semiconductor material is in contact with a layer of a ferromagnetic or a metamagnetic electrical insulator material and suitable electrodes are positioned on opposite sides of the layers so that an applied electrical current flows from one electrode to the other electrode by passing through both of the layers. The function of the diode is controlled by an externally applied magnetic field which is selectively controllable in its alignment and amplitude.

The ferromagnetic and metamagnetic materials utilized in the invention generally comprise transition element chalcogenides, preferably rare earth chalcogenides such as europium chalcogenides, binary chromium thiospinel and binary chromium halogen spinel chalcogenides. The chalcogenide materials utilized in the invention include oxides as the chalcogenides. In at least certain of the preferred embodiments, the ferromagnetic and metamagnetic materials are europium chalcogenides, such as binary sulfides and selenides. In other embodiments, the ferromagnetic and metamagnetic materials are chromium spinels having a general formula: $A\ Cr_2\ X_3\ Z$ wherein A is selected from the group consisting of Cu, Cd, Eu, Fe, Hg, Zn and mixtures thereof; X is selected from the group consisting of S, Se, Te and mixtures thereof; and Z is selected from the group consisting of Br, Cl, I and mixtures thereof.

DESCRIPTION OF THE PREFERRED EMBODIMENTS

Figure 1:
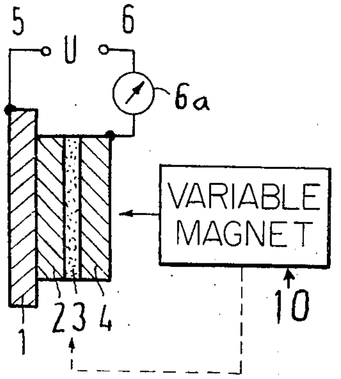
FIG. 1 is an elevational diagrammatic view of an embodiment of a magnetically controllable electronic diode structure constructed and operable in accordance with the principles of the invention.

The invention provides a magnetically controllable electronic diode structure including at least a pair of electrodes spaced apart from one another with the electrodes being composed of an electrically conductive material selected from the group of a metal and a material having electrical conductive properties of a metal, such as a ferromagnetic degenerately doped semiconductor, a super-conductive material and other like materials. A layer of a ferromagnetic semiconductor material is positioned in contact with one of the pair of electrodes and a layer of a ferromagnetic or metamagnetic electrical insulator material is positioned in contact with the other of the pair of electrodes and with the layer of ferromagnetic semiconductor material so that an applied electrical current flows through the diode structure from one of the electrodes to the other electrode by passing through the ferromagnetic semiconductor material and the ferromagnetic or metamagnetic electrical insulator material and is controlled by an externally applied magnetic field.

In one preferred embodiment of the invention, the diode structure comprises a pair of electrodes spaced from one another with a layer of a ferromagnetic semiconductor material in contact with a first electrode of the pair of electrodes and a layer of a ferromagnetic electrical insulator material in contact with the second of the pair of electrodes and with the layer of ferromagnetic semiconductor material. An applied electrical current flows through the diode structure from the first electrode to the second electrode by passing through the layer of ferromagnetic semiconductive material and the layer of ferromagnetic dielectric material.

In certain preferred forms of this embodiment, the ferromagnetic semiconductor material is magnetically harder or has a higher coercive force than the ferromagnetic electrical insulator material. Such diode structure includes a means for applying a controllable magnetic field having an amplitude sufficiently large to control magnetization alignment in the layer of ferromagnetic electrical insulator material without changing the magnetization in the ferromagnetic semiconductor material.

In other preferred forms of this embodiment, the ferromagnetic semiconductor material and the ferromagnetic electrical insulator material have essentially equal coercive force and the magnetization alignment of such materials deviates from one another within the respective layers thereof, as by crystal anisotropy. Such diode structures include a means for applying a controllable magnetic field to controllably change the deviation angle of magnetization alignments in the layers relative to one another.

In another preferred embodiment of the invention, the diode structure comprises a pair of electrodes spaced from one another, with a layer of a ferromagnetic semiconductor material in contact with a first electrode of the pair of electrodes and a layer of a metamagnetic electrical insulator material in contact with a second of the pair of electrodes and with the layer of ferromagnetic semiconductor material. An applied electrical current flows through such a diode structure from the first electrode to the second electrode by passing through the layer of ferromagnetic semiconductor material and the layer of metamagnetic dielectric material. The diode structure includes a means for applying a controllable magnetic field having a direction and an amplitude sufficiently large to control the magnetization alignment in the metamagnetic electrical insulator layer relative to the magnetization alignment in the ferromagnetic semiconductor layer.

In further embodiments of the invention, the diode structure is comprised of a pair of electrodes spaced apart from one another, with at least one of the pair of electrodes being composed of a ferromagnetic degenerately doped semiconductor material and a layer of a ferromagnetic or metamagnetic electrical insulator material is positioned in contact with the ferromagnetic semiconductor electrode and with the other of the pair of electrodes. An applied electrical current flows through such diode structure from one electrode to another electrode by passing through the ferromagnetic semiconductor electrode and the layer of ferromagnetic or metamagnetic electrical insulator material. The diode structure includes a means for applying a controllable magnetic field to change the relative relation of the magnetization alignment and magnitude between the ferromagnetic semiconductor material and the ferromagnetic or metamagnetic electrical insulator material.

The ferromagnetic and metamagnetic materials of the invention generally comprise transition element chalcogenides. Preferred chalcogenides are europium chalcogenides and binary chromium thiospinel chalcogenides and binary chromium halogen spinel chalcogenides. The preferred europium chalcogenides are binary sulfides and selenides. The preferred chromium spinels have a general formula: $A\ Cr_2\ X_3\ Z$ wherein A is selected from the group consisting of Cu, Cd, Eu, Fe, Hg, Zn and mixtures thereof; X is selected from the group consisting of S, Se, Te and mixtures thereof; and Z is selected from the group consisting of Br, C1, I and mixtures thereof. A specific form of such chromium spinels is a copper-chromium halide chalcogenide.

In order to provide the necessary semiconductor properties to certain materials of the invention, at least to the extent that such properties are not initially present therein, doping techniques are utilized to include elements of a different valence into the crystalline arrangement of such materials. The amount of dopant varies for each select material and is generally dependent at least in part on the energy band distance in the select material and on the extent of energy band-splitting due to the effects of spin-polarized magnetic bands. Accordingly, a sufficiently large doping amount is selected to obtain a desired degree of conductivity. For example, europium chalcogenides are preferably doped with a rare earth trivalent element, such as gadolinium. In a specific example, bivalent europium sulfide is doped with an amount ranging up to about 0.05 percent of gadolinium. By utilizing sufficiently large amounts of a doping element in a material of the invention, the material attains degenerately doped N+ characteristics. Some of the spinel materials utilized in the practice of the invention initially have requisite semiconductor properties and others are provided with such properties by the above mentioned doping techniques.

In one preferred embodiment of the invention the ferromagnetic semiconductor material is selected so as to have a higher coercive force than the ferromagnetic or metamagnetic electrical insulator material utilized in a diode structure formed in accordance with the principles of the invention.

Occupation of the energy states in the conduction band of a material is also achived by charge-carrier injection, optical stimulation and/or thermal stimulation.

Preferably, a ferromagnetic semiconductor material having occupied energy states in its conduction band (with or without a charge-carrier injection or optical and/or thermal stimulation) is utilized in the practice of the invention. Such occupied energy states in the conduction band are sometimes referred to as degeneration of electron gas and materials containing such energy states are generally referred to as ferromagnetic degenerately doped semiconductor materials or as ferromagnetic degenerately doped N+ semiconductor materials.

The electrodes of the invention are composed of a metal or of another material having similar electric conduction properties. Such other electrically conductive materials include the ferromagnetic semiconductor materials utilized in the practice of the invention appropriately doped to become degenerately doped semiconductor materials. Accordingly, in certain embodiments of the invention the diode structure includes a pair of electrodes spaced apart from one another wherein at least one of such electrodes is composed of the ferromagnetic semiconductor material utilized in the practice of the invention. Such ferromagnetic semiconductor electrode is arranged in contact with a layer of a ferromagnetic or metamagnetic electrical insulator material and the insulator layer is arranged in contact with the other electrode so that an applied current passes through the semiconductor electrode to the other electrode by passing through the insulator layer.

The diode structure of the invention also has utility in low temperature fields of use, i.e., in superconductive applications. Such diode structures include at least one superconductive electrode material.

The invention is generally based on the theory that electron transfer between a ferromagnetic semiconductor layer and an adjacent ferromagnetic or metamagentic insulator layer can be influenced by an externally applied magnetic field.

The term "ferromagnetic semiconductor" is defined in the art, for example, see "Zeitschrift fuer Physik" (Journal for Physics), Vo. 217 (1968), p. 91. Generally, a ferromagnetic semiconductor material has an energy band scheme similar to semiconductors and has an energy band spacing similar to semiconductors, i.e. with a maximum of a few electron volts. Such ferromagnetic semiconductor materials also have energy levels of electrons from partially occupied inner shells. Partially occupied inner shells primarily occur with the *3d*and *4f*-transition elements or cations. In this connection, reference is made to the exemplary materials discussed hereinabove. As the term "ferromagnetic" indicates, such a material has a substantially uniform alignment of the spin moments of its electrons in the various additional levels or shells at temperatures below the Curie temperature of such material. These levels generally form one or more relatively narrow bands in the solid state member and are referred to as magnetic bands.

The terms "ferromagnetic or metamagnetic electrical insulator" as utilized herein generally denotes a material having electrical conductivity correspondingly to that of an electrical insulator. Generally, such materials have a conduction band free of electrons, i.e., not occupied by electrons. A metamagnetic insulator material is defined as a material having anti-ferromagnetic characteristics at low strength magnetic fields and having ferromagnetic characteristics when subjected to higher strength magnetic fields. Metamagnetic electrical insulator materials are known, for example, see Solid State Communications, Vol. 6, No. 8 (1968), pp. 553–558 or Physics Letters, Vol. 27A, No. 10 (1968), pp. 664–665 for a discussion of individual metamagnetic materials and additional metamagnetic characteristics (both of which publications are incorporated herein by reference).

Referring now to the drawings, FIG. 1 illustrates an exemplary embodiment of a diode structure formed in accordance with the principles of the invention. The illustrated diode structure is comprised of a pair of electrodes 1 and 4 spaced apart from one another by layers 2 and 3. Preferably, a first electrode such as 1 is a small metal plate. Layer 2 is composed of a ferromagnetic semiconductor material and is mounted generally contiguously with a surface of electrode 1. Layer 3 is composed of a ferromagnetic electrical insulator material or a metamagnetic electrical insulator material and is mounted onto layer 1 in superimposed lamina-like relation. The other electrode 4 is mounted onto an exposed surface of layer 3 so as to have a general contiguous surface therewith. Electrical leads or connection means 5 and 6 are provided on the electrodes 1 and 4, respectively, for the application of electrical voltage U therebetween or for interconnection with an electical circuit (not shown). A current indicator 6*a* is connected in the circuit between lead 6 and electrode 4 for indicating the current of the diode structure. A magnetic field means 10 is positioned in working relation to the diode structure for applying a magnetic field that is variable in direction and magnitude to change the impedance of the diode. For electron transfer from the ferromagnetic semiconductor layer 2 to the ferromagnetic or metamagnetic electrical insulator layer 3, the layer would be selected to be n-type and layer 3 p-type materials and the negative terminal of the voltage source U would be connected to lead 5 and the positive terminal to lead 6. The current flow through the diode structure may be varied by the direction and amplitude or magnitude of an applied magnetic field. For example, diode structures of the invention are useful in an electronic circuit as magnetically controllable electronic switching means or as magnetically controllable electronic amplifier means, or as a detector means for indicating the direction and amplitude of an unknown magnetic field.

Figure 2:
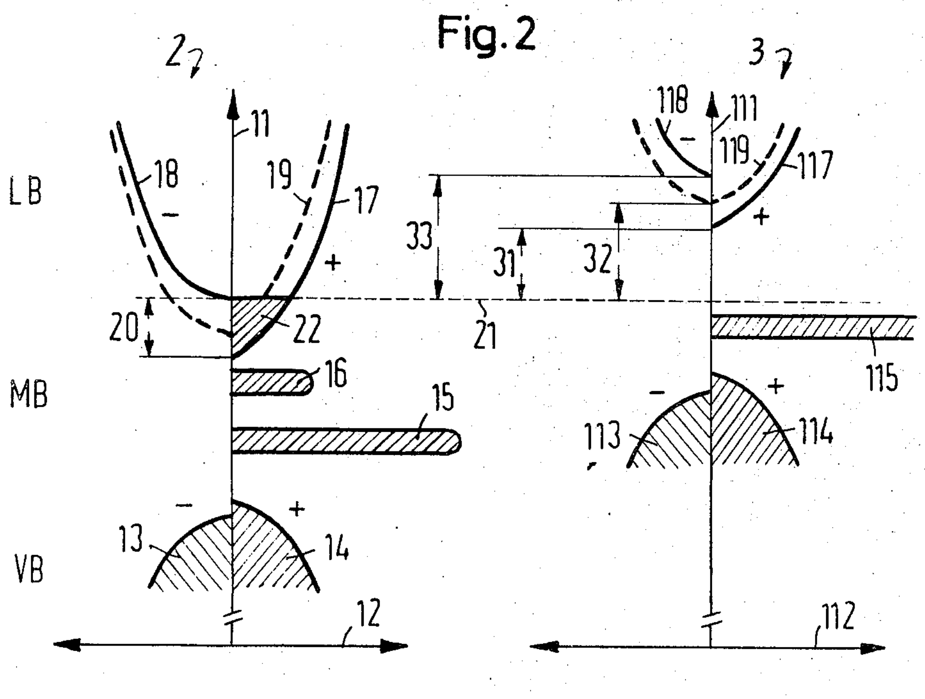
FIG. 2 is a graph illustration of the energy band scheme for a ferromagnetic semiconductor material and a ferromagnetic or metamagnetic electrical insulator material of the invention wherein energy is plotted along the ordinate and density of the energy states is plotted along the abscissa.

For a better understanding of the principles of the invention, attention is directed to the graphical representation at FIG. 2. The left-hand side of FIG. 2 illustrates the energy band scheme of a ferromagnetic semiconductor material utilized in forming layer 2 of the exemplary diode structure discussed and the right-hand side of FIG. 2 illustrates the energy band scheme of a ferromagnetic electronic insulator material utilized in forming layer 3 of the exemplary diode structure discussed. The energy band scheme of a degenerately doped ferromagnetic semiconductor material, such as for example bivalent europium sulfide doped with an amount $x$ of trivalent gadolinium is illustrated in the left-hand side of FIG. 2. Preferably, the doping amoung $x$ ranges from 0 to about 0.05 percent so as to provide degenerately doped semiconductor characteristics. Energy is plotted along the ordinate 11 and the density of the energy states is plotted along the abscissa 12. The valence band, designated as VB is illustrated as being split into negative and positive sub-bands 13 and 14 respectively. The magnetic band, designated as MB is shown as being divided into a magnetic band 15 of the europium ions and a (magnetic) donor band 16, e.g., of the dopingly-effective gadolinium ions. The split conduction band, designated LB, is split into negative and positive sub-bands 17 and 18 respectively. The lower subheband of the conduction band of the missing split, such as above the Curie temperature (without an applied magnetic field) is generally illustrated by the dotted line 19. The double-headed arrow 20 generally indicates a value of energy splitting of the sub-bands 17 and 19 and which is based on the exchange interaction between the ions of the magnetic band and the conduction electrons. The doping, such as utilized in attaining the degenerately doped ferromagnetic semiconductor materials used in certain embodiments of the invention produces a Fermi level 21 positioned immediately below the higher energy sub-band. When the doping amount is sufficiently large, the conduction electrons occupy sites in the conduction band only in the area designated by reference numeral 22, i.e., the conduction electrons appear to have only one spin polarization.

Electrons in a sub-band of the conduction band effect electric conductivity in the manner of a semiconductor. Additionally, these electrons are spin-polarized due to their exchange interaction with their own magnetic moment. Accordingly, the electrons in the conduction band appear to have a uniform alignment of their spin moments. The position of the Fermi level 21 in the conduction sub-band 17 is characteristic of a medium such as a ferromagnetic degenerately doped semiconductor material. The energy position of the Fermi level 21 is essentially determined by the amount of doping substance present within the ferromagnetic semiconductor material. A decrease in the amount of doping substance lowers the position of the Fermi level below the conduction sub-bands 17, 18 or 19. However, a material having such a low amount of doping substance therein is no longer referred to as a degenerately doped semiconductor material. Nevertheless, a ferromagnetic semiconductor material having such a low amount of doping substance therein is utilized as a medium in the practice of the invention with electron injection in the conduction band, such as by thermal or optical stimulation. The injected electrons occupy the area 22 of sub-band 17 and thus provide sufficient electrical conduction for the operation of a diode structure utilizing such materials therein.

The electron occupation of the conduction band preferably does not occur within the sub-bands 18 and 19 beyond the area 22. As indicated earlier, an exemplary ferromagnetic degenerately doped semiconductor material useful in the practice of the invention is europium sulfide doped with up to about 0.05 percent of gadolinium. Of course, other ferromagnetic semiconductor materials can be doped with other or the same doping substance in amounts generally similarly large to obtain a desired degree of conductivity.

The right-hand illustration of FIG. 2 represents the energy band scheme of a ferromagnetic electrical insulator material utilized in forming layer 3 of the exemplary diode structure discussed earlier. The coordinate axes 111 and 112 correspond to the coordinate axes 11 and 12 explained in discussing the left-hand illustration of FIG. 2. The energy reference point of the two energy schemes illustrated on opposite sides of FIG. 2 to each other is the Fermi level 21. Since the layer 3 is composed of a ferromagnetic electrical insulator material, the Fermi level is positioned in the energy band scheme of such a material between the upper occupied magnetic band 115 and the conduction sub-bands 117 and 118, which are unoccupied by electrons in a state of relative rest. Other electron energy states are designated by reference numerals 113, 114 and 119 and these energy states generally correspond to the energy states 13, 14 and 19 explained in conjunction with the energy band scheme shown on the left-hand side of FIG. 2.

For an electron to pass from layer 2 (the left-hand side of FIG. 2) into one of the individual energy states 117, 118 or 119 of the conduction band in layer 3 (the right-hand side of FIG. 2), an energy threshold of a certain value or resistance, such as schematically indicated by double-headed arrows 31, 32 and/or 33 must be overcome. The value of the energy threshold is primarily dependent upon the magnetization alignment in layer 3, which is controllable by the externally applied magnetic field. In other words, the value of the energy threshold is regulated by the alignment and amplitude of magnetization in layer 3 in relation to the alignment and amplitude of magnetization in layer 2. The relative relationship of magnetization in layers 2 and 3 is controllably changed or kept constant in response to an externally applied magnetic field.

The physical mode of regulating the function of a diode structure constructed in accordance with the principles of the invention can be better understood by considering two exemplary diode structures. In one embodiment, layer 3 is composed of a ferromagnetic electrical insulator material and in the other embodiment layer 3 is composed of a metamagnetic electrical insulator material. In both embodiments the layer 2 is composed of a ferromagnetic semiconductor material and preferably of a ferromagnetic semiconductor material having a higher coercive force than the ferromagnetic or metamagnetic electrical insulator material forming layer 3. The amplitude and direction of the externally applied magnetic field is controllable and it is generally maintained below the coercive force of layer 2 but sufficiently above the coercive force of layer 3 to allow controllable alignment of magnetization in layer 3.

Three extreme exemplary magnetic switching states I, II and III are attainable by proper control of the magnetic field externally applied to a diode structure of the invention. To attain switching states I and III, the magnetization alignment in the plane of layer 3 is caused to be either parallel (i) or antiparallel (II) to the relatively permanent magnetization alignment in layer 2. The switching state II is attained with a ferromagnetic electrical insulator material (of layer 3) having a magnetization alignment caused by crystal anisotropy and which is perpendicularly aligned to the magnetization alignment in layer 2. With a metamagnetic electrical insulator material in layer 3, one attains switching state II by applying an external magnetic field having a small amplitude, i.e., by providing a dwindling magnetic alignment in layer 3. With the switching states I, II or III respectively, one of the energy thresholds 31, 32 or 33 (FIG. 2) respectively becomes effective. As can be visualized from the influence of a magnetic field on the transfer of electrons as explained hereinbefore, the amplitude of electrical current passing through a diode structure constructed in accordance with the principles of the invention can be selectively changed. In an embodiment thereof utilizing a ferromagnetic electrical insulator material the amplitude of electrical current passing through the diode structure is changed by the direction and amplitude of an external magnetic field and in an embodiment thereof utilizing a metamagnetic electrical insulator material the amplitude of the electric current is changed by removing an external magnetic field.

Further, even when the materials of layers 2 and 3 have essentially equal coercive force, different switching states I, II or III are attained by control of the magnetic field applied to a diode structure including such materials. In such situations, the magnetization alignment in layers 2 and 3 are initially selected, as by crystal anisotropy in relation to each other so as to deviate from one another within their respective layer levels. Preferably, the magnetization alignments in layers 2 and 3 are arranged so as to be perpendicular to each other. Crystal anisotropy is preferably obtained during the production of the individual layers 2 and 3 respectively, for example as by vaporization and deposition of a select material for layers 2 or 3 in a controlled magnetic field.

The physical effectiveness of the just described embodiment can be more readily understood by considering the following explanation. The easy axis of magnetization (i.e., axis of magnetization alignment at zero magnetic field) of one of the layers defines with the easy axis of magnetization of the other layer an angle, preferably a right angle. A switching state, such as switching state II, may be provided with a relatively small externally applied magnetic field as, for example, in the range of 10 to 200 oerstads which does not influence the magnetization alignment of the other layer. The magnetization alignment in each of the layers becomes parallel with the application of a magnetic field having a proper alignment. An externally applied magnetic field having an alignment along the direction of the resulting vector or angle bisecting the original angle between the magnetization alignments of the layers, causes a decrease of such original angle and a decrease in an energy threshold for electron transfer between the layers. An extreme switching state I is obtained by causing the magnetization alignment of layers 2 and 3 to be parallel to one another. An increase of an energy threshold in relation to said decrease in energy threshold is attained by applying an external magnetic field aligned in a direction which is not parallel to the resultant vector of the magnetization alignments in layers 2 and 3. A further extreme switching state III is obtained by causing the magnetization alignment of layers 2 and 3 to be at substantially right angles to each other by the proper application of an externally applied magnetic field.

A continuous variation of energy thresholds is readily attained by utilizing a corresponding continuous control of the magnetization alignment in one of the layers in relation to the magnetization alignment in the other layer. In this manner, a continuous modulation of a diode current is obtained by varying the impedance of the diode by a factor of about 1,000,000 to one.

Since extremely rapid and coherent changes of magnetization alignment in magnetic layers are possible, extremely high-frequency switching or modulation can be provided with a diode structure of the invention. Within the switching states I, II or III, Schottky currents having a ratio of about $10^6$ to one are switched or modulated with the diode structure of the invention. Accordingly, the invention provides a diode structure that is very rapidly switched from a current passing state to a current blocking state and vice versa with the controlled application of low magnetic power (i.e., power for producing the externally applied magnetic field) and a continuously applied electrical voltage. The externally applied magnetic field is preferably essentially independent of the applied electrical voltage and thus from the current passing through the diode structure. The current passing through such a diode structure increases exponentially with increases in voltage.

In accordance with the principles explained in conjunction with Schottky currents, tunnel currents are also magnetically controlled with a diode structure formed in accordance with the principles of the invention. The current in the individual switching state can be varied over several orders of magnitude.

Figure 3:
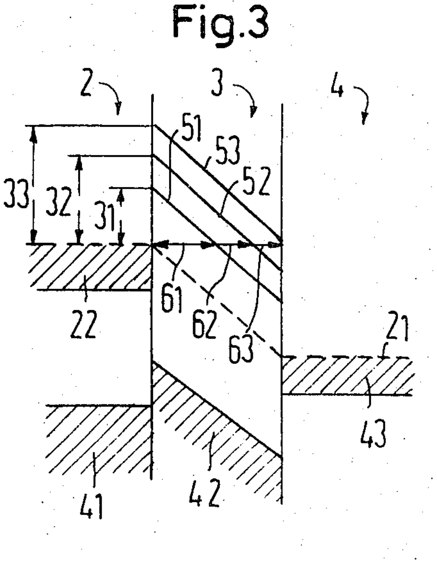
FIG. 3 is a graph illustrating the energy band scheme of an electrode, a ferromagnetic semiconductor layer and a ferromagnetic or metamagnetic electrical insulator layer of a diode structure having an applied electrical voltage and operating in accordance with the principles of the invention.

FIG. 3 graphically illustrates the energy band scheme of the various layers 2, 3 and 4 (as described in conjunction with FIG. 1) of an exemplary diode structure during the application of an electrical voltage. Recapitulating briefly, layer 2 is a ferromagnetic semiconductor, layer 3 is a ferromagnetic or metamagnetic electrical insulator and layer 4 is an electrically conductive electrode. Reference numeral 21 indicates the position of the Fermi level, which is not a straight line because of the applied voltage and is bent within the highly resistive layer 3. Reference numeral 22 indicates a portion of the conduction band of the ferromagnetic semiconductor layer 2 that is occupied by electrons up to the Fermi level 21. Reference numeral 41 indicates the valence band of the ferromagnetic semiconductor layer 2 and reference numeral 42 indicates the valence band of the ferromagnetic or metamagnetic electrical insulator layer 3. Reference numeral 43 indicates a portion of the conduction band of electrically conductive layer 4 that is occupied by electrons up to the Fermi level 21. Reference numerals 51, 52 and 53 respectively, indicate the lower boundaries of conduction subbands 117, 118 and 119 (best seen at the right-hand illustration of FIG. 2) of the ferromagnetic or metamagnetic electrical insulator layer 3. Such lower boundaries depend upon the relative magnetization alignment in layer 3 in relation to the polarization of electrons in area 22 (right-hand illustration of FIG. 2) of the conduction band of layer 2 in achieving transfer of such electrons.

The transfer of electrons from layer 2 via layer 3 to layer 4 is effected according to the Schottky-emission principle and/or tunnel effect. The intensity of electron transfer is dependent on the value of the potential energy threshold between layers 2 and 3 and that must be overcome or be tunnelled through.

The double-headed arrows 31, 32 and 33 schematically indicate the energy threshold values that are of importance for Schottky currents, while double-headed arrows 61, 62 and 63 schematically indicate the energy threshold values that are of importance for tunnel currents.

A diode structure formed in accordance with the principles of the invention has numerous fields of utility. In one preferred utility, a diode structure of the invention is used in an electronic circuit as a magnetically controlled electronic switching means and in another preferred utility, a diode structure of the invention is used in an electronic circuit as a magnetically controlled electronic amplifier means. The invention may also be used to detect unknown magnetic fields.

In summation, the invention provides a magnetically controllable electric diode structure that includes a pair of electrodes spaced apart from one another, with the electrodes being composed of an electrically conductive material selected from the group of metals and materials having the electrical conductive properties of metals, such as ferromagnetic degenerately doped semiconductor materials, superconductive materials, etc. A layer of a ferromagnetic semiconductor material is positioned in contact with one of the pair of electrodes and a layer of a ferromagnetic or metamagnetic electrical insulator material is positioned in contact with the other of the pair of electrodes and with the layer of ferromagnetic semiconductor material so that an electrical current flows through the diode structure from one of the electrodes to the other electrode by passing through the ferromagnetic semiconductor material and the ferromagnetic or metamagnetic electrical insulator material. The function of the diode structure is controlled by the application of an external magnetic field controllable in its alignment and amplitude.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as is set forth and defined in the hereto-appendant claims.

I claim as my invention:

1. In a magnetically controllable electric diode structure comprising;
   - a pair of electrodes spaced from one another,
   - a layer of a ferromagnetic semiconductor material in contact with a first electrode of said pair of electrodes,
   - a layer of a ferromagnetic electrical insulator material in contact with a second electrode of said pair of electrodes and with said layer of ferromagnetic semiconductor material,
   - whereby an applied electrical current flows through the diode structure from said first electrode to said second electrode by passing through said layer of ferromagnetic semiconductor material and said layer of ferromagnetic electrical insulator material, said ferromagnetic semiconductor material having a higher coercive force than said ferromagnetic electrical insulator material, and means for applying a controllable magnetic field having an amplitude sufficiently large to control alignment of the magnetization in the ferromagnetic electrical insulator layer.

2. In a magnetically controllable diode structure according to claim 1 wherein said means for applying a controllable magnetic field supplies a field strong enough to vary the magnetic alignment in said insulator layer but weak enough not to substantially change the magnetic alignment in said semiconductor material.

3. In a magnetically controlled diode according to claim 2 wherein said means for applying a controllable magnetic field supplies a field having a strength less than 200 oersteds to said insulator material.

4. In a magnetically controlled diode according to claim 2 wherein said means for applying a controllable magnetic field supplies a field having a strength less than 100 oersteds to said insulator material.

5. A magnetically controllable electric diode structure comprising;

a pair of electrodes spaced from one another, a layer of a ferromagnetic semiconductor material in contact with a first electrode of said pair of electrodes, a layer of a ferromagnetic electrical insulator material in contact with a second electrode of said pair of electrodes and with said layer of ferromagnetic semiconductor material, whereby an applied electrical current flows through the diode structure from said first electrode to said second electrode by passing through said layer of ferromagnetic semiconductor material and said layer of ferromagnetic electrical insulator material, said ferromagnetic semiconductor material and said ferromagnetic electrical insulator material having essentially equal coercive force and having magnetization alignment deviating from one another within their respective layers, and means for applying a controllable magnetic field to controllably change the deviation angle between the magnetization alignments of said layers.

6. A magnetically controllable electric diode structure comprising;

a pair of electrodes spaced from one another, a layer of a ferromagnetic semiconductor material in contact with a first electrode of said pair of electrodes, a layer of metamagnetic electrical insulator material in contact with a second electrode of said pair of electrodes and with said layer of the ferromagnetic semiconductor material, whereby an applied electrical current flows through the diode structure from said first electrode to said second electrode by passing through said layer of ferromagnetic semiconductor material and said layer of metamagnetic electrical insulator material, and means for applying a controllable magnetic field having an amplitude sufficiently large to control the alignment of magnetization in the metamagnetic electrical insulator layer in relation to the magnetization alignment in the ferromagnetic semiconductor layer.

7. In a magnetically controllable diode structure according to claim 6 wherein said means for applying a controllable magnetic field supplies a field strong enough to vary the magnetic alignment in said insulator layer but weak enough not to substantially change the magnetic alignment in said semiconductor material.

8. In a magnetically controlled diode according to claim 7 wherein said means for applying a controllable magnetic field supplies a field having a strength less than 200 oersteds to said insulator material.

9. In a magnetically controlled diode according to claim 7 wherein said means for applying a controllable magnetic field supplies a field having a strength less than 100 oersteds to said insulator material.

10. A magnetically controllable electric diode structure comprising;

a pair of electrodes spaced from one another, said electrodes being formed of an electrically conductive material selected from the group consisting of a metal, a superconductive material, and a ferromagnetic degenerately doped semiconductor material, a layer of ferromagnetic semiconductor material in contact with a first electrode of said pair of electrodes, said ferromagnetic semiconductor material comprising a transition element chalcogenide, a layer of a ferromagnetic or a metamagnetic electrical insulator material in contact with a second electrode of said pair of electrodes and with said layer of the ferromagnetic semiconductor material, said ferromagmetic or metamagnetic electrical insulator material comprising a transition element chalcogenide, whereby an applied electrical current flows through the diode structure from said first electrode to said second electrode by passing through said layer of ferromagnetic semiconductor material and said layer of ferromagnetic or metamagnetic electrical insulator material, and means for applying a controllable magnetic field to change the relative relation of the magnetization alignment of said ferromagnetic semiconductor layer in relation to said ferromagnetic or metamagnetic electrical insulator layer.

11. A magnetically controllable electric diode structure as defined in claim 10 wherein the ferromagnetic semiconductor material comprises a ferromagnetic degenerately doped semiconductor material.

12. A magnetically controllable electric diode structure as defined in claim 10 wherein the ferromagnetic semiconductor material has a higher coercive force than the ferromagnetic or the metamagnetic electrical insulator material.

13. In a magnetically controllable diode structure according to claim 12 wherein said means for applying a controllable magnetic field supplies a field strong enough to vary the magnetic alignment in said insulator layer but weak enough not to substantially change the magnetic alignment in said semiconductor material.

14. In a magnetically controlled diode according to claim 13 wherein said means for applying a controllable magnetic field supplies a field having a strength less than 200 oersteds to said insulator material.

15. In a magnetically controlled diode according to claim 13 wherein said means for applying a controllable magnetic field supplies a field having a strength less than 100 oersteds to said insulator material.

16. A magnetically controllable electric diode structure as defined in claim 10 wherein the ferromagnetic or the metamagnetic electrical insulator material comprises a bivalent europium chalcogenide.

17. A magnetically controllable electric diode structure as defined in claim 16 wherein the bivalent europium chalcogenide is selected from the group consisting of europium sulfide and europium selenide.

18. A magnetically controllable electric diode structure as defined in claim 10 wherein the ferromagnetic or the metamagnetic electrical insulator material comprises a binary chromium spinel chalcogenide of the general formula: $A Cr_2 X_3 Z$ wherein A is selected from the group consisting of Cu, Cd, Eu, Fe, Hg, Zn and mixtures thereof; X is selected from the group consisting of S, Se, Te and mixtures thereof; and Z is selected from the group consisting of Br, Cl, I and mixtures thereof.

19. A magnetically controllable electric diode structure as defined in claim 18 wherein the binary chromium spinel is a copper-chromium halide chalcogenide.

20. A magnetically controllable electric diode structure as defined in claim 10 wherein the ferromagnetic semiconductor material is degenerately doped with an element having a different valence from the cations of such ferromagnetic semiconductor material.

21. A magnetically controllable electric diode structure as defined in claim 10 wherein the ferromagnetic semiconductor material and the ferromagnetic or metamagnetic electrical insulator materials have magnetization alignment deviating from one another within their respective layers.

22. A magnetically controllable electric diode structure as defined in claim 21 wherein the deviation angle between the magnetization alignment is the ferromagnetic semiconductor material and the magnetization alignment in the ferromagnetic or metamagnetic electrical insulator material is a right angle.

23. A magnetically controllable electric diode structure as defined in claim 10 for use in an electronic circuit as a magnetically controllable electronic switch means.

24. A magnetically controllable electric diode structure as defined in claim 10 for use in an elecronic circuit as a magnetically controlled electronic amplifier means.

25. A magnetically controllable electric diode structure as defined in claim 10 for use in an electronic circuit as a magnetically controlled modulator.

26. A magnetically controllable electric diode structure as defined in claim 10 wherein the ferromagnetic or the metamagnetic electrical insulator material is a rare earth chalcogenide.

27. Means for detecting a magnetic field comprising:

a voltage source,
a region of ferromagnetic semiconductor material of a first conductivity type,
a region of ferromagnetic electrical insulator material connected to said ferromagnetic semiconductor material to form a diode,
said ferromagnetic semiconductor material being different from said ferromagnetic electrical insulator material,
opposite terminals of said voltage source connected across said ferromagnetic semiconductor material and said ferromagnetic electrical insulator material to pass current therethrough,
indicator means connected in circuit with said voltage source and said diode to indicate the current therethrough such that in the presence of a magnetic field the impedance of said diode varies as a function of the direction and magnitude of said magnetic field.

* * * * *